United States Patent [19]

Chan et al.

[11] Patent Number: 5,148,350

[45] Date of Patent: Sep. 15, 1992

[54] PORTABLE ELECTRONICS APPARATUS HOUSING AND CHASSIS

[75] Inventors: Huen S. Chan; Chee S. Leong; Dah C. Lim, all of Singapore, Singapore

[73] Assignee: Motorola, Inc., Schaumburg, Ill.

[21] Appl. No.: 513,135

[22] Filed: Apr. 23, 1990

[51] Int. Cl.⁵ .............................................. H05K 7/20
[52] U.S. Cl. ................... 361/386; 174/35 R; 361/394; 361/399; 361/424
[58] Field of Search ............... 174/35 R, 386–389, 174/391, 393–395, 399, 424

[56] References Cited

U.S. PATENT DOCUMENTS

| | | | |
|---|---|---|---|
| 3,668,476 | 6/1972 | Wrabel et al. | 361/395 |
| 4,388,672 | 6/1983 | Skill | 361/395 |
| 4,557,225 | 12/1985 | Sagues et al. | 361/395 |
| 4,652,969 | 3/1987 | Stegenga | 361/399 |

FOREIGN PATENT DOCUMENTS 2212331  7/1989  United Kingdom ............... 361/386

Primary Examiner—Gregory D. Thompson
Attorney, Agent, or Firm—M. Mansour Ghomeshi

[57] ABSTRACT

A housing including heatsink and cam surfaces formed as a single unit and a chassis formed integrally with screw-less circuit board mounting apparatus and designed to fit within the housing so that power transistors mounted on a circuit board are urged into heat conducting contact with the heatsink by the cam surfaces when circuit boards are assembled on the chassis and the chassis is assembled in the housing.

12 Claims, 4 Drawing Sheets

PORTABLE ELECTRONICS APPARATUS HOUSING AND CHASSIS

The present invention pertains to a housing and chassis which is assembled with out the use of screws and the like and more particularly to a housing which is a single integral unit and a chassis constructed as an integral unit and formed to be assembled within the housing without the use of screws, etc.

BACKGROUND OF THE INVENTION

In portable electronics apparatus, and especially portable communications apparatus, it is extremely time consuming and costly to assemble housings and chassises by attaching a plurality of parts with screws and/or bolts. In some instances a plurality of parts are attached by spot welding, soldering, etc. but this requires not only extra assembly steps but additional costly equipment. In many instances screws and the like must be placed in positions which are difficult to access. As electronics apparatus is further reduced in size, screws and the like must be made smaller, which makes them more difficult and costly to manufacture and more difficult and costly to assemble. Also, screws and the like can become a limiting factor in the ultimate size of electronics assemblies.

SUMMARY OF THE INVENTION

It is an object of the present invention to provide a new and improved screw-less housing for portable electronics apparatus.

It is a further object of the present invention to provide a chassis having circuit board mounting apparatus formed as an integral part thereof and formed to fit within the screw-less housing.

It is a further object of the present invention to provide a new and improved screw-less housing incorporating a heatsink and cam surfaces for urging mounted power transistors into heat conducting contact with the heatsink.

It is further object of the present invention to provide a new and improved method of manufacturing and assembling a housing and mating chassis.

It is a further object of the present invention to provide a new and improved method of manufacturing a screw-less chassis with snap-in circuit board mounting apparatus formed as an integral part thereof.

Some of the above objects and other objects of the present invention are realized in a screw-less housing for portable electronic apparatus containing at least one power transistor, the housing including an external heat sink formed as a portion of the housing and defining an inner contact surface of the housing, and at least one cam surface formed within said housing in juxtaposition to the inner contact surface so as to allow the insertion, between the cam surface and the inner contact surface, of a member mounting the power transistor, the cam surface being formed to urge the power transistor into heat conducting contact with the inner contact surface when the member is properly positioned, and in methods of manufacturing and assembling the screw-less housing.

Some of the above objects and other objects are realized in portable electronic apparatus comprising a housing, and a chassis constructed to fit within said housing and including at least a planar portion with snap catches and locating bosses formed on opposing surfaces of the planar portion for receiving printed circuit boards in generally parallel juxtaposition with the opposing sides of the planar portion, said chassis, including the snap catches and locating bosses, being formed as an integral unit, and in methods of manufacturing and assembling the electronic apparatus.

BRIEF DESCRIPTION OF THE DRAWINGS

Referring to the drawings, wherein like parts are designated with like numbers throughout the figures.

DESCRIPTION OF THE PREFERRED EMBODIMENTS

Figure 1:
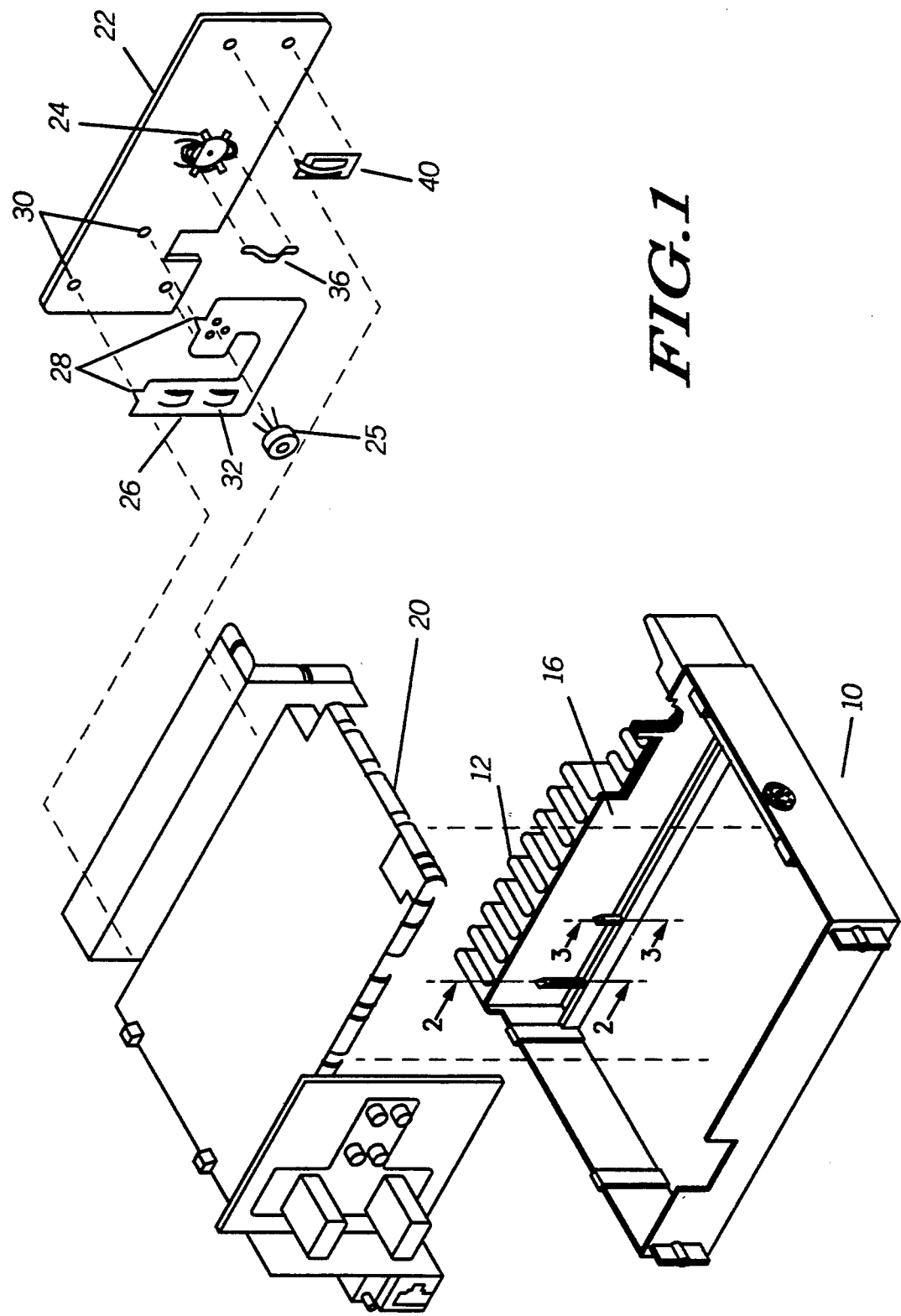
FIG. 1 is an exploded view in perspective of portable communications apparatus embodying the present invention.

Referring specifically to FIG. 1, a housing 10 is illustrated including a heatsink 12 and cam surfaces 14. Heat sink 12 forms a side of housing 10 and has an inner contact surface 16. Cam surfaces 14 are formed within housing 10 in juxtaposition to inner contact surface 16, as will be described in more detail presently. Housing 10 is formed as a single integral unit by some convenient method such as casting or molding metal. A convenient metal to use is, for example, aluminum which is a good electrical and heat conducting material and is easy to cast or mold.

A chassis 20 having a plurality of electronic boards attached thereto, as will be explained in detail presently, is designed to fit within housing 10. Chassis 20 has a power board 22 affixed to a front edge thereof in downwardly extending relationship so that power board 22 is inserted between cam surfaces 14 and inner contact surface 16 when chassis 20 is properly positioned within housing 10. Power board 22 has one or more power transistors 24 affixed thereto in a normal manner. It should be understood that the terms "power board", "circuit board", etc. used throughout this description are meant to encompass any of the various types of mounting boards and structures utilized in the industry, including but not limited to printed circuit boards, substrates, etc. Cam surfaces 14 are positioned in relation to inner contact surface 16 so that transistor 24 is urged into heat conducting contact with inner contact surface 16 as power board 22 (and chassis 20) is positioned in housing 10. In this specific embodiment two cam surfaces 14 are provided, with one positioned adjacent to transistor 24 and one positioned adjacent to a second transistor 25. However, it will be understood by those skilled in the art that a great variety of single or plural cam surfaces may be provided for different configurations of housing and power boards.

Since cam surfaces 14 are formed with and in the same process as housing 10, there may be some variation (manufacturing tolerances) in spacing between inner contact surface 16 and cam surfaces 14. These variations in spacing may be reduced by reducing the manufacturing tolerances, molding the cam surfaces with a positive tolerance and modifying (e.g. grinding)

the cam surfaces after molding to make the spacing uniform, or by utilizing springs in conjunction with power board 22 to insure a good heat conducting contact between transistor 24 and inner contact surface 16. In this specific embodiment the latter method of utilizing springs is incorporated.

Figure 2:
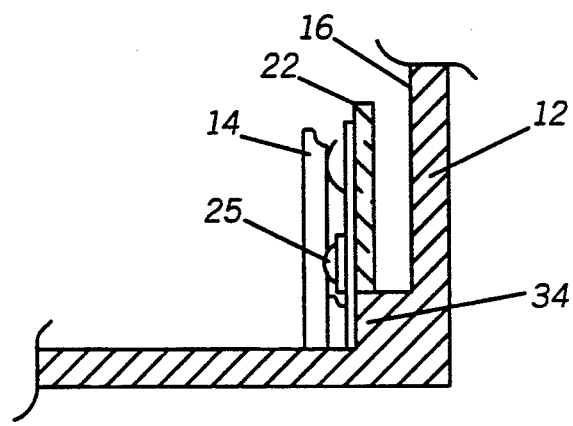
FIG. 2 is an enlarged sectional view as seen from the line 2—2 in FIG. 1 with portions thereof removed.

A first type of spring that may be utilized is illustrated in the embodiment of spring retainer 26. A flat piece of spring material is used to form spring retainer 26. A central opening is formed in the flat piece to substantially surround transistor 25 on power board 22. Several hook shaped protrusions 28 are formed integrally with the flat piece so as to extend into openings 30 in power board 22. Protrusions 28 are formed of the same spring material so that they firmly engage power board 22 and hold spring retainer 26 in the correct position. Two leaf springs 32 are also formed integrally with the flat piece and extend outwardly away from power board 22 so as to but against one of cam surfaces 14. An enlarged sectional view of this relationship is illustrated in FIG. 2. In this specific embodiment transistor 25 is not a power transistor that requires a heatsink and, therefore, a small protrusion 34 is formed in housing 10 adjacent to inner contact surface 16 to space power board 22 from inner contact surface 16 and prevent shorting of the leads of transistor 25.

Figure 3:
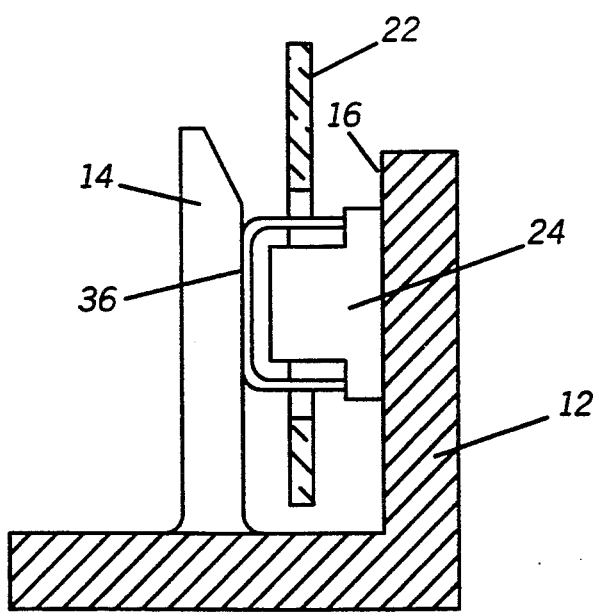
FIG. 3 is an enlarged sectional view as seen from the line 3—3 in FIG. 1 with portions thereof removed.

A second U type spring 36 is utilized in conjunction with transistor 24. Spring 36 is constructed so that the ends fit through openings in power board 22 on each side of transistor 24 and bear against the case, or included heatsink, of transistor 24. The bight of spring 36 extends outwardly beyond the case of transistor 24 and power board 22 to but against the other cam surface 14. An enlarged sectional view of this arrangement is illustrated in FIG. 3.

A third spring retainer 40 is constructed similar to spring retainer 26, except that it has a single leaf spring and does not surround a transistor or other components. Spring retainer 40 is engaged in power board 22 at the end opposite to the end mounting spring retainer 26 and serves to maintain power board 22 straight. Spring retainers 26 and 40 and spring 36 are very easy and inexpensive to manufacture. It will of course be understood by those skilled in the art that many other types and embodiments of springs might be utilized and the ones illustrated are for example only. Also, it will be realized by those skilled in the art that manufacturing tolerances can be substantially reduced by utilizing springs in conjunction with cam surfaces 14 to provide the required heat conducting contact and because the springs are inexpensive to manufacture and assemble the manufacturing costs can be substantially reduced.

Figure 4:
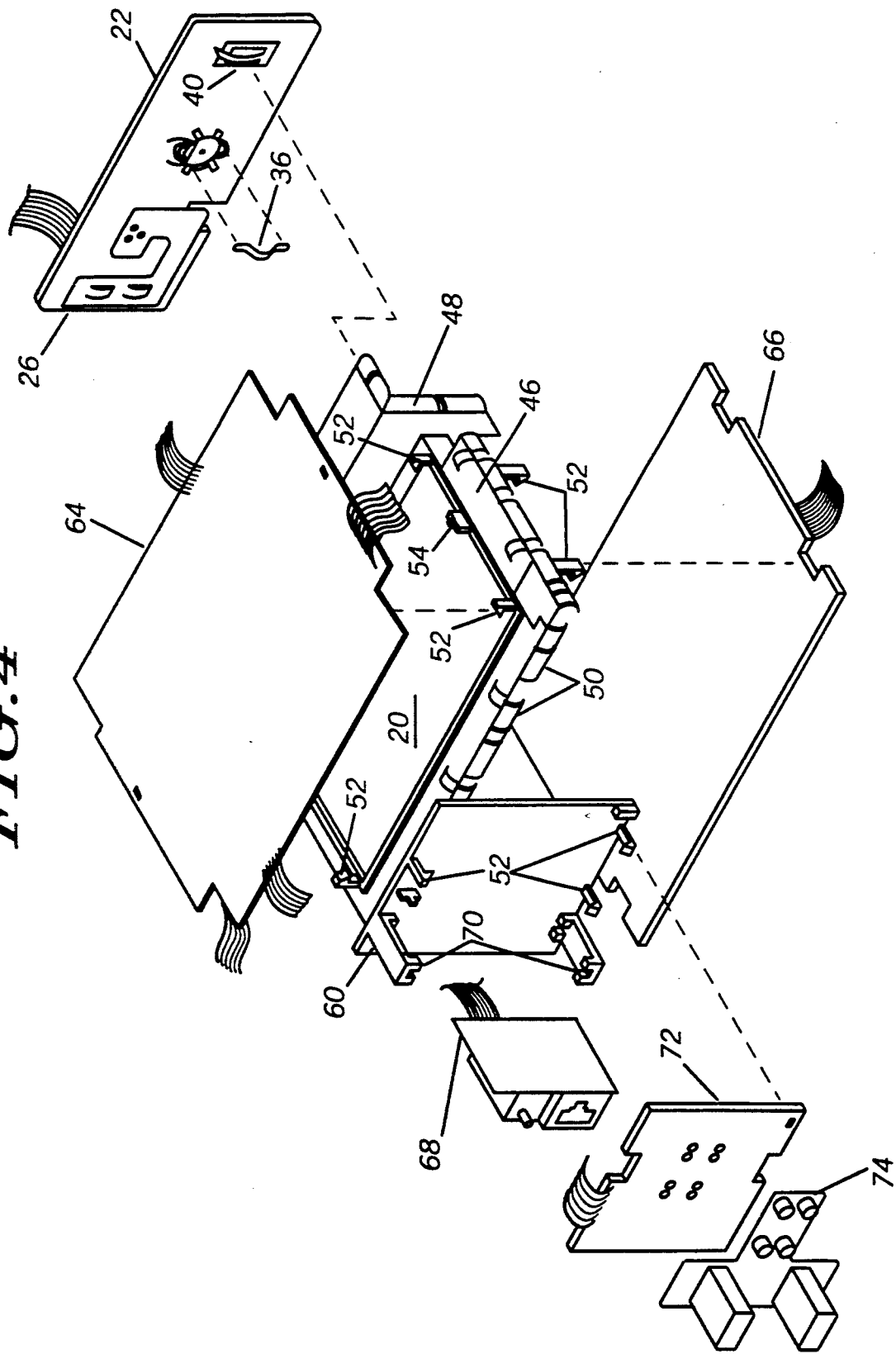
FIG. 4 is an exploded view in perspective of a portion of the apparatus illustrated in FIG. 1.

Referring specifically to FIG. 4, chassis 20 and the associated circuit boards are shown in more detail. Chassis 20 includes a planar portion 46 and a portion 48 having an L shaped cross section formed as integral parts from a single sheet of metal or other electromagnetic shielding material. Planar portion 46 of chassis 20 has spring contacts 50 formed (in a well known manner) adjacent the edges thereof to contact the inner surfaces of housing 10 and provide electromagnetic shielding between areas above and below planar portion 46.

A plurality of snap catches 52 and locating bosses 54 are formed on chassis 20 by some convenient method such as molding. Portions 46 and 48 of chassis 20 may be conveniently stamped from a sheet of thin metal and have openings formed therethrough for the flow of material between the opposed surfaces thereof. In the preferred embodiment, portions 46 and 48 of chassis 20 are placed in a mold and snap catches 52 and locating bosses 54 are outsert molded thereon. By providing openings through the metal, the molded parts are firmly bonded to the metal and formed as an integral part thereof. It will be understood by those skilled in the art that portion 48 could be simply formed of plastic molded to portion 46 or it could have a metal base as suggested above. Also, a third board mounting section 60 is molded onto planar portion 46 along a portion of an edge thereof and positioned generally at right angles to planar portion 46. Snap catches 52 and locating bosses 54 are molded as an integral part of section 60. It will of course be understood by those skilled in the art that the terms "snap catches" and "locating bosses" are generic terms describing any devices for holding a circuit board at a fixed distance from chassis 20 and the specific devices illustrated are only for example.

A logic board 64 is mounted generally parallel and adjacent to the upper surface of planar portion 46 of chassis 20 by snap catches 52 and locating bosses 54. An RF board 66 is mounted generally parallel and adjacent to the lower surface of planar portion 46 of chassis 20 by snap catches 52 and locating bosses 54 (some of which are not known). A switch board 68 is mounted on section 60 by means of opposed clamps 70, which are molded on the surface of section 60 as an integral part thereof. A display board 72, having a keypad board 74 mounted thereon, is mounted on section 60, generally parallel with and adjacent to the outwardly directed surface thereof, by means of snap catches 52 and locating bosses 54. In a similar fashion, power board 22 is mounted on portion 48 of chassis 20.

It should be noted that all of the various boards are quickly and easily mounted by simply snapping them into place. No screws, soldering, or spot welding is required. Further, the entire chassis 20 is constructed as an integral unit in a single outsert molding (casting) step and does not require any screws, soldering or spot welding. Also, chassis 20 provides electromagnetic shielding between logic board 64, RF board 66 and power board 22.

Figure 5:
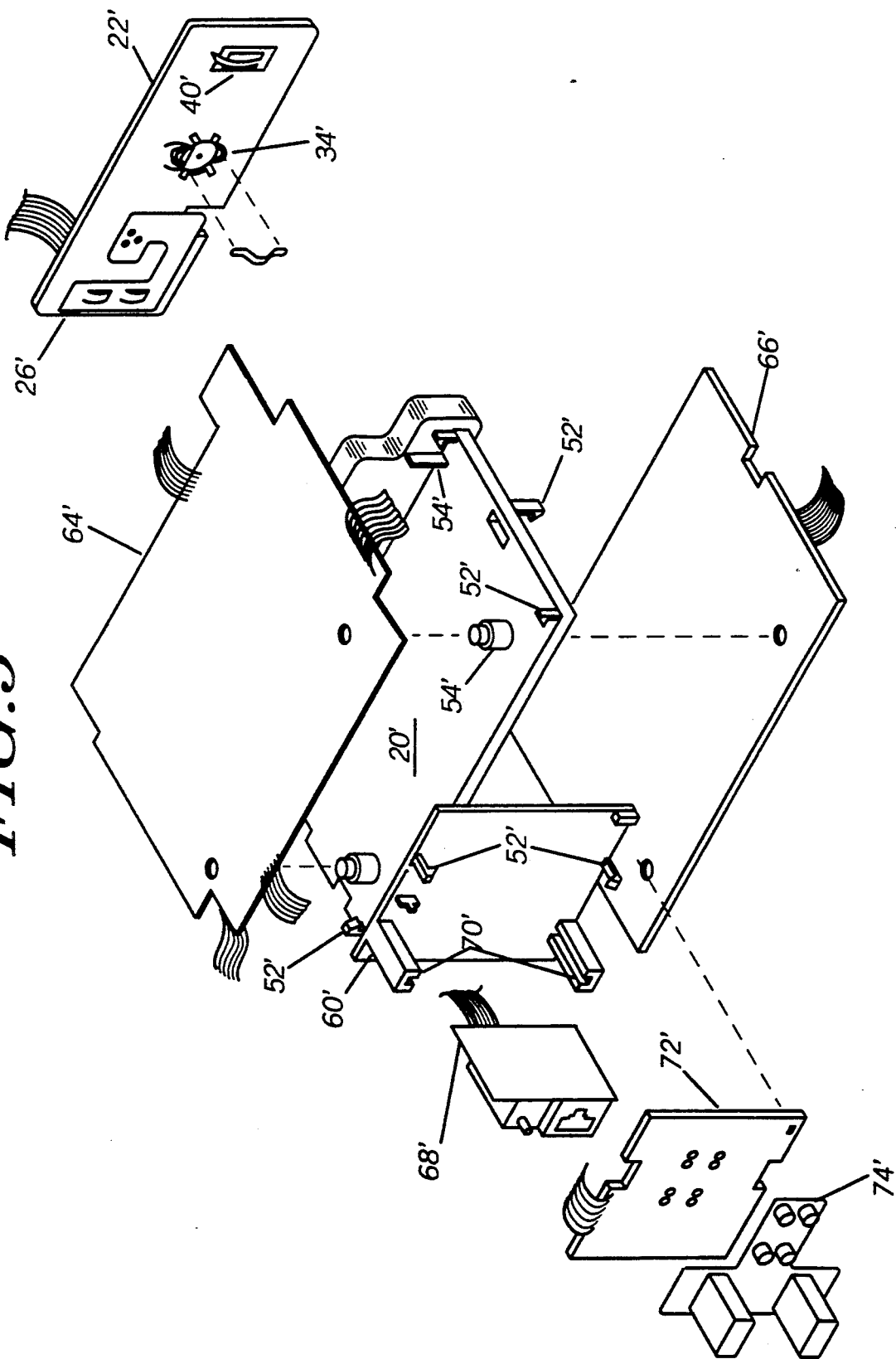
FIG. 5 is an exploded view in perspective similar to FIG. 4 of another embodiment of the portion of the apparatus.

Referring specifically to FIG. 5, another embodiment of the chassis and board assembly is illustrated. In this embodiment like parts are designated with similar numbers having a prime (') added to indicate the different embodiment. Chassis 20' is formed by molding (casting) from an electrically conducting polymer. Polymers of the type utilized are readily available commercially and, therefore, will not be described in detail herein. The various parts are generally similar to those described in conjunction with FIG. 4 and operate as described above. No base of metal material need be used. Chasssis 20' requires a simpler and cheaper mold and is somewhat easier to manufacture because it is not necessary to place the metal sections in the mold before each molding operation. However, it has been found that chassis 20, with the metal section, provides somewhat better shielding. It is presumed that this is due to the somewhat poorer conducting characteristics of the polymers presently available.

Accordingly, we have shown and described a new and novel housing and chassis for portable electronic apparatus whereby the apparatus can be manufactured very simply and assembled with no screws, soldering, or welding. The specific embodiments illustrated and described are for communications devices but it is believed that other portable electronics apparatus will also benefit from these improvements. The manufacturing and assembly steps have been greatly reduced and simplified to reduce cost and provide for future reductions in size. While we have shown and described specific embodiments of this invention, further modifications and improvements will occur to those skilled in the art. We desire it to be understood, therefore, that this invention is not limited to the particular forms shown and we intend in the appended claims to cover all modifications that do not depart from the spirit and scope of this invention.

What we claim is:

1. A screw-less housing for portable electronic apparatus containing at least one power transistor, the housing comprising:
    an external heatsink formed as a portion of the housing and defining an inner contact surface of the housing; and
    at least one cam surface formed within said housing in juxtaposition to the inner contact surface so as to allow the insertion, between the cam surface and the inner contact surface, of a member mounting the at least one power transistor, the cam surface being formed to urge the power transistor into heat conducting contact with the inner contact surface when the member is inserted between the cam surface and the inner contact surface.

2. A screw-less housing as claimed in claim 2 wherein the integral unit is formed of a single casting.

3. A screw-less housing as claimed in claim 2 wherein the integral unit is formed of a single molding.

4. Portable electronic communications apparatus comprising:
    a mounting member having at least one power transistor mounted thereon; and
    a screw-less housing formed as a single integral unit and including an external heatsink defining an inner contact surface of the housing and at least one cam surface formed within said housing in juxtaposition to the inner contact surface so as to allow the insertion of said mounting member between the cam surface and the inner contact surface, the cam surface being formed to urge the power transistor into heat conducting contact with the inner contact surface when said mounting member is inserted between the cam surface and the inner contact surface.

5. Portable electronic communications apparatus as claimed in claim 5 wherein the mounting member is a power transistor circuit board and further includes spring devices affixed thereto in a position to bear against the cam surface of said housing to increase the heat conducting contact between the power transistor and the inner contact surface of the heatsink.

6. Portable electronic communications apparatus as claimed in claim 6 including in addition a chassis constructed to fit within the housing and formed of electromagnetic shielding material, the power transistor circuit board being affixed to the chassis in generally outwardly extending relationship therewith, said chassis further having a planar section constructed to electrically contact inner surfaces of the housing adjacent the edges of said planar section and including spring catches formed on opposing surfaces thereof for receiving circuit boards in generally parallel juxtaposition thereto with circuit boards mounted adjacent opposing surfaces being shielded from each other by said chassis.

7. Portable electronic communications apparatus as claimed in claim 7 wherein the chassis including molded snap catches and locating bosses affixed to the opposing surfaces thereof is formed of a moldable conductive plastic.

8. Portable electronic communications apparatus as claimed in claim 7 wherein the chassis includes preformed shielding metal with plastic snap catches and locating bosses molded in extending relationship thereon to form an integral unit.

9. A method of constructing and assembling screwless portable electronic communications apparatus comprising the steps of:
    forming a metal housing, including an external heatsink having an inner contact surface and at least one cam surface adjacent to the inner contact surface, in a single integral unit;
    forming a chassis of electromagnetic shielding material which fits within said housing and includes a planar portion constructed to electrically contact inner surfaces of said housing adjacent edges thereof and a power board mounting portion;
    forming plastic snap catches and locating bosses on opposing surfaces of the planar portion;
    providing a power board having at least one power transistor thereon, an RF board and a logic board;
    mounting the power board on the power board mounting portion of the chassis and mounting the RF board and the logic board on opposing sides of the planar portion of the chassis by means of the snap catches and locating bosses thereon; and
    positioning the chassis in the housing so that the power board is inserted between the cam surface and the inner contact surface and the power transistor is urged into heat conducting contact with the inner contact surface and the planar portion of the chassis electrically contacts inner surfaces of the housing adjacent edges thereof to substantially shield the RF board from the logic board.

10. A method as claimed in claim 9 wherein the step of forming a metal housing is performed in a single step.

11. A method as claimed in claim 9 wherein the steps of forming a chassis and forming plastic snap catches and locating bosses are performed in a single molding step utilizing an electrically conductive polymer.

12. A method as claimed in claim 9 including in addition the step of affixing springs to the power baord prior to the step of positioning the chassis in the housing, said springs being positioned to engage the cam surface of the housing to increase the heat conducting contact between the power transistor and the inner contact surface of the heat sink.

* * * * *